(12) United States Patent
Crocker et al.

(10) Patent No.: US 7,117,931 B2
(45) Date of Patent: Oct. 10, 2006

(54) SYSTEMS FOR LOW COST LIQUID COOLING

(75) Inventors: Michael T. Crocker, Portland, OR (US); Daniel P. Carter, Bainbridge Island, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/027,417

(22) Filed: Dec. 31, 2004

(65) Prior Publication Data

US 2006/0144570 A1    Jul. 6, 2006

(51) Int. Cl.
*F28F 7/02* (2006.01)

(52) U.S. Cl. ............... 165/104.33; 165/80.4; 165/185

(58) Field of Classification Search ........... 165/104.33, 165/104.21, 104.26, 80.4, 185; 361/697, 361/699, 704; 257/714–716; 174/15.1
See application file for complete search history.

(56) References Cited

U.S. PATENT DOCUMENTS

| 4,322,737 | A |   | 3/1982 | Sliwa, Jr. |
|---|---|---|---|---|
| 5,099,311 | A |   | 3/1992 | Bonde et al. |
| 5,285,347 | A | * | 2/1994 | Fox et al. ................... 361/699 |
| 5,316,077 | A | * | 5/1994 | Reichard ............... 165/104.28 |
| 5,412,535 | A |   | 5/1995 | Chao et al. |
| 6,019,165 | A | * | 2/2000 | Batchelder ................ 165/80.3 |
| 6,536,516 | B1 | * | 3/2003 | Davies et al. ............... 165/170 |
| 6,785,134 | B1 | * | 8/2004 | Maveety et al. ............ 361/699 |
| 2003/0051859 | A1 | * | 3/2003 | Chesser et al. ................ 165/46 |
| 2003/0056939 | A1 | * | 3/2003 | Chu et al. .................. 165/80.4 |
| 2003/0062149 | A1 | * | 4/2003 | Goodson et al. ....... 165/104.11 |
| 2004/0188064 | A1 | * | 9/2004 | Upadhya et al. ........... 165/80.3 |
| 2005/0178529 | A1 |   | 8/2005 | Suzuki |

FOREIGN PATENT DOCUMENTS

| JP | 2000323636 | * | 11/2000 | ................ 165/80.4 |
|---|---|---|---|---|
| JP | 093202697 | * | 9/2004 | ................ 165/80.4 |

OTHER PUBLICATIONS

"PCT International Search Report of the International Searching Authority", mailed Jun. 30, 2006, for PCT/US2005/047691, 3pgs.

* cited by examiner

*Primary Examiner*—Teresa J. Walberg
(74) *Attorney, Agent, or Firm*—Buckley, Maschoff & Talwalkar LLC

(57) ABSTRACT

According to some embodiments, systems for low cost liquid cooling may be provided. In some embodiments, a system may comprise a core having a first end and a second end, wherein the core defines a cavity extending between the first and second ends, a plurality of fins extending outwardly from the core between the first and second ends, an inlet to accept a fluid, an outlet to evacuate the fluid, and a shaped element disposed within the cavity of the core, wherein the shaped element is to direct the fluid within the cavity. According to some embodiments, the system may further comprise a pump that may comprise a housing defining an inlet to accept the fluid and an outlet to evacuate the fluid, an impeller disposed within the housing, wherein the impeller is to move the fluid toward the outlet, a motor to power the impeller, and a cold plate disposed at least partially within the housing.

15 Claims, 8 Drawing Sheets

SYSTEMS FOR LOW COST LIQUID COOLING

BACKGROUND

Electrical devices, such as computers, are comprised of multiple electrical components (e.g., processors, voltage regulators, and/or memory devices). Electrical components typically dissipate unused electrical energy as heat, which may damage the electrical components and/or their surroundings (e.g., other electrical components and/or structural devices such as casings, housings, and/or electrical interconnects). Various means, such as heat sinks and heat pipes, have been utilized to control and/or remove heat from electrical components and their surroundings.

As electrical devices, such as Personal Computer (PC) devices and even computer servers, are reduced in size however, space and cost constraints become limiting design factors. Typical heat mitigation devices, for example, take up considerable amounts of room within electrical devices and/or include expensive components. As electrical devices increase in processing speed and power, their components will generate even more heat that must be removed. Typical heat mitigation devices may not be suitable for removing adequate amounts of heat from electrical components, particularly where space and cost are concerns.

DETAILED DESCRIPTION

Figure 1:
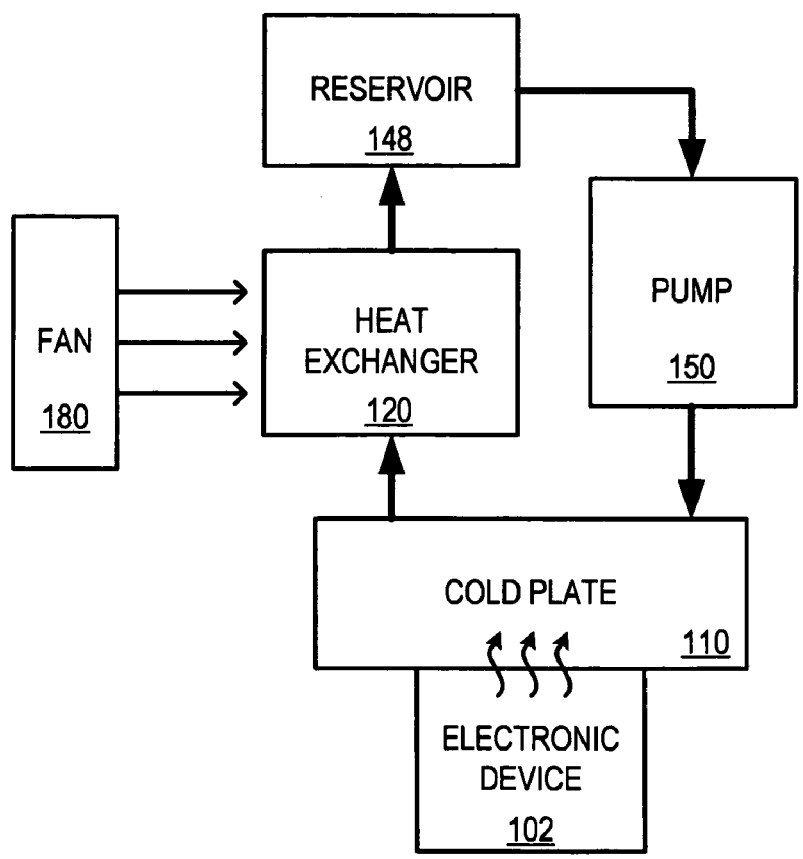
FIG. 1 is a block diagram of a system.

Referring first to FIG. 1, a block diagram of a system 100 is shown. The various systems described herein are depicted for use in explanation, but not limitation, of described embodiments. Different types, layouts, quantities, and configurations of any of the systems described herein may be used without deviating from the scope of some embodiments. Fewer or more components than are shown in relation to the systems described herein may be utilized without deviating from some embodiments.

The system 100 may comprise, for example, an electronic device 102 (such as a processor, memory device, a voltage regulator, etc.), a cold plate 110, a heat exchanger 120, a reservoir 148, a pump 150, and/or a fan 180. In some configurations, the electronic device 102 may generate heat and/or may transfer heat to the cold plate 110. The cold plate 110 may, for example, be coupled to the electronic device 102 to accept and/or remove heat from the electronic device 102. Heat may travel through conduction, in some configurations, from the electronic device 102 to the cold plate 110 (e.g., as depicted via the wavy lines in FIG. 1).

In some configurations, the cold plate 110 may transfer heat to the heat exchanger 120. The heat exchanger 120 may, for example, be a heat sink and/or radiator configured to expel and/or dissipate heat. In the case that the heat exchanger 120 comprises fins (not shown in FIG. 1) for dissipating heat, for example, the fan 180 may facilitate the removal and/or dissipation of heat from the heat exchanger 120. The fan 180 may, in some configurations, direct air toward the heat exchanger 120 (and/or any fins thereof) to facilitate forced convection to remove heat from the heat exchanger 120. The system 100 may also or alternatively comprise the pump 150. The pump 150 may, according to some configurations, circulate a fluid within the system 100.

For example, the heat transferred by the electronic device 102 to the cold plate 110 may be directed to and/or transferred to (e.g., conducted to) a fluid (such as water) that circulates through the cold plate 110. The heated fluid may then, for example, proceed to the heat exchanger 120 to transfer heat to the heat exchanger 120 and/or to otherwise dissipate the heat within the fluid. The heat exchanger 120 may, for example, remove heat from the fluid. The cooled fluid (e.g., cooled relative to the heated fluid and/or the cold plate 110) may then proceed to the reservoir 148. The reservoir 148 may, for example, store a quantity of the fluid for use in the system 100. The fluid may then, for example, circulate through the pump 150 (e.g., a centrifugal pump) and/or be drawn from the reservoir 148 by the pump 150. The fluid may then proceed (and/or be directed) back to the cold plate 110 to remove more heat from the cold plate 110 (e.g., by allowing heat to transfer from the cold plate 110 into the cooled fluid).

Figure 2:
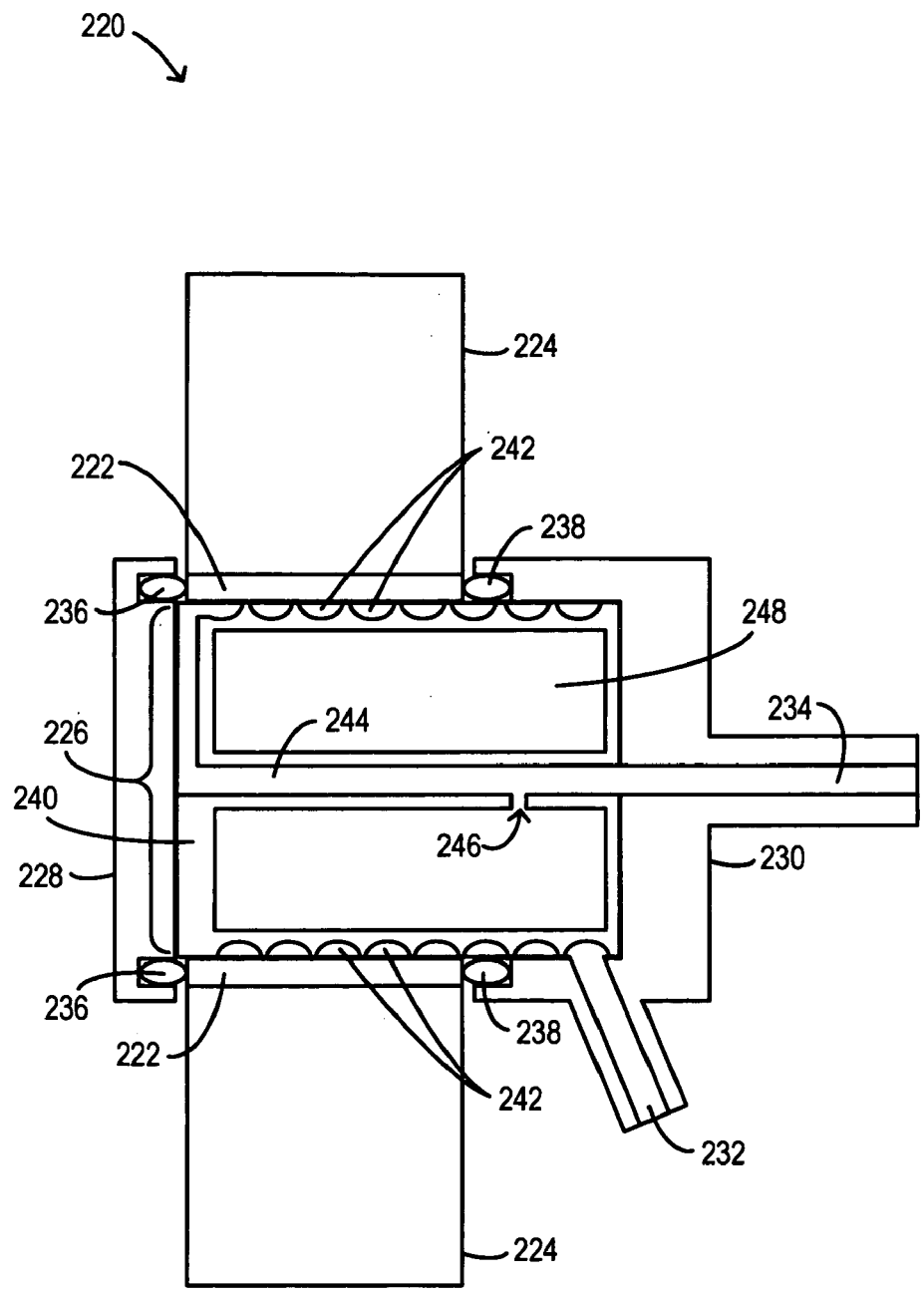
FIG. 2 is a cross-sectional diagram of a heat exchanger according to some embodiments.

Turning to FIG. 2, a cross-sectional diagram of a heat exchanger 220 according to some embodiments is shown. In some embodiments, the heat exchanger 220 may be similar to the heat exchanger 120 described in conjunction with FIG. 1. The heat exchanger 220 may, for example, be configured to remove, transfer, and/or dissipate (e.g., radiate) heat. In some embodiments, fewer or more components than are shown in FIG. 2 may be included in the heat exchanger 220. In some embodiments, the heat exchanger 220 may comprise a core 222. In some embodiments, the heat exchanger 220 may comprise one or more fins 224 extending outwardly from the core 222. The fins 224 may, for example, be configured to dissipate and/or conduct heat from the core 222. The core 222, according to some embodiments, may define a cavity 226. As shown in FIG. 2, for example, a cross-sectional view of the heat exchanger 220 shows the core 222 in an annular and/or hollow cylindrical configuration defining the cavity 226. The core 222 (and/or the fins 224) may, for example, comprise a low-cost aluminum hollow form extrusion.

According to some embodiments, the heat exchanger 220 may accept heat from within the cavity 226 of the core 222. A fluid may be circulated within the cavity 226, for example, to transfer and/or conduct heat to the heat exchanger 220. In some embodiments, the heat exchanger 220 may comprise a first end cap 228 coupled to the core 222 to retain the fluid within the cavity 226. According to some embodiments, a hydraulic and/or hermetic seal may be formed between the core 222 and the first end cap 228. In such a manner, for example, fluid circulating within the cavity 226 of the core 222 may be substantially prohibited from leaking from the left side of the heat exchanger 220 (e.g., as oriented in FIG. 2), and/or air may be substantially prevented from entering the fluid flow within the cavity 226 (e.g., from outside of the heat exchanger 220).

In some embodiments, the heat exchanger 220 may also or alternatively comprise a second end cap 230. The second end cap 230 may, for example, be coupled to the core 222 to substantially prevent the fluid from leaking from the right side of the heat exchanger 220 (and/or to substantially prevent air from entering the cavity 226). In some embodiments, the second end cap 230 may be configured to provide, receive, evacuate, and/or otherwise transport the fluid. For example, the second end cap 230 may comprise an inlet 232 and/or an outlet 234. The inlet 232 and/or the outlet 234 may, according to some embodiments, be or include a fluid path (e.g., a conduit and/or a channel) to receive and/or evacuate the fluid, respectively. The fluid may be received via the inlet 232, for example, in a heated state, be cooled by the heat exchanger 220 (i.e., it may transfer heat to the heat exchanger 220), and be evacuated via the outlet 234 in a cooled state. In some embodiments, the inlet 232 and/or the outlet 234 may be configured and/or oriented any manner that is or becomes known or practicable. As shown in FIG. 2, for example, the inlet 232 and/or the outlet 234 may be configured to transport the fluid to and/or from particular and/or specific areas within the cavity 226 of the core 222.

In some embodiments, the coupling of the first end cap 228 and/or the second end cap 230 to the core 222 may be conducted in any manner that is or becomes known or practicable. For example, a first O-ring 236 may be disposed between the first end cap 228 and the core 222 and/or a second O-ring 238 may be disposed between the second end cap 230 and the core 222. The O-rings 236, 238 may, according to some embodiments, facilitate the creation of a hydraulic and/or hermetic seal between the core 222 and the end caps 228, 230. In some embodiments, the end caps 228, 230 may be configured to accept the O-rings 236, 238 to provide an improved seal. The end caps 228, 230 may, for example, comprise any number of grooves, detents, threads, lips, seats, and/or other features that facilitate coupling to the core 222 and/or creation of a hydraulic and/or hermetic seal (e.g., to substantially prevent fluid from leaking from the cavity 226 and/or to substantially prevent air from infiltrating the cavity 226).

According to some embodiments, the heat exchanger 220 may also or alternatively comprise an element 240 disposed within the cavity 226 of the core 222. The element 240 may, for example, be configured to transport and/or direct the fluid within the cavity 226 of the core 222. The element 240 may also or alternatively facilitate retention of the fluid within the heat exchanger 220 and/or sealing of the cavity 226. In some embodiments, the element 240 may comprise one or more grooves 242 (and/or other features). The grooves 242 may, for example, define one or more channels via which the fluid may be transported and/or directed within the cavity 226 of the core 222. In some embodiments, the grooves 242 may comprise a single groove 242 configured in a substantially spiral pattern on the exterior surface of the element 240. The spiral groove 242 may, for example, define a channel between the outer surface of the element 240 and the inner surface of the core 222 (e.g., along the surface of the cavity 226 of the core 222).

In some embodiments, the inlet 232 of the second end cap 230 may be oriented to direct fluid into the channel defined by the spiral groove 242. The fluid may proceed, for example, through the channel along the inner surface of the core 222, progressing from the right side of the cavity 226 of the core 222 to the left side of the cavity 226 of the core 222 (e.g., in accordance with the spiral channel defined by the spiral groove 242). According to some embodiments, the fluid may transfer heat to the core 222 as it travels through the channel. The groove 242 may be configured, for example, to direct the fluid over a large area of the inner surface of the core 222, to transfer a substantial amount of heat to the core 222 (e.g., via conduction).

The fluid may, for example, be directed by the groove 242 (and/or the channel defined thereby) to scrub a substantial amount of the inner surface of the core 222 to transfer a substantial amount of heat to the core 222. In some embodiments, the element 240 and/or the groove 242 may be configured to adjust the fluid flow properties within the cavity 226 of the core 222. The groove 242 may be designed and/or configured, for example, to establish certain properties of the channel defined by the groove 242. The channel properties may, according to some embodiments, be configured and/or defined to cause the fluid flow to be either laminar or turbulent, as is desirable and/or practicable for transferring heat to the core 222. Turbulent fluid flow within the channel may, for example, increase the convection of heat through and/or within the fluid, thereby increasing the efficiency of heat transfer to the walls of the core 222.

In some embodiments, the groove 242 may terminate at and/or lead to the left end of the element 240 and/or substantially at the left end of the cavity 226 of the core 222. The fluid may proceed, for example, from the groove 242 and along the surface of the first end cap 228. In some embodiments, the fluid may be directed through a central portion of the element 240 toward the outlet 234. The fluid may, for example, flow through a central conduit 244 extending from the left end of the element 240 to the right end of the element 240. The central conduit 244 may, for example, transport cooled fluid (e.g., fluid that has transferred heat to the core 222) directly from the left end of the element 240 and/or cavity 226 to the outlet 234. The conduit 244 may, for example, substantially prevent the cooled fluid from being re-heated by the heated fluid entering the cavity 226 from the inlet 232 by maintaining a separation between the incoming and outgoing fluid flows.

In some embodiments, the heat exchanger 220 may also or alternatively comprise a fluid path 246 that permits the cooled fluid to enter a reservoir 248 (and/or that permits fluid from within the reservoir 248 to exit the reservoir 248 and enter the central conduit 244). The reservoir 248 may, for example, be a cavity defined by the element 240. According to some embodiments, the reservoir 248 may be disposed within and/or defined by a vacant and/or void area in the central portion of the element 240. The central conduit 244 may, for example, pass through the reservoir 248. In some embodiments, the reservoir 248 may provide a thermal mass (e.g., air, water, and/or another fluid) to reduce the impact of large and/or severe thermal events. The reservoir 248 may, for example, store a quantity of fluid to supply extra fluid to the heat exchanger 220 in the case that extra fluid is needed and/or to provide thermal dampening as required. According to some embodiments, if fluid leaks from the heat exchanger 220 (e.g., due to old O-rings 236, 238 and/or from seepage through hydroscopic plastic elements or components) over the life of the heat exchanger 220, for example, the extra fluid in the reservoir 248 may replenish the lost amounts.

The replacement and/or augmentation of the fluid within the fluid paths of the heat exchanger 220 may, for example, substantially prevent air bubbles from forming and/or being introduced into the fluid flow. In some embodiments, the reservoir 248 may, for example, also or alternatively function as an air trap to collect air bubbles from the fluid flow. The reservoir 248 may, according to some embodiments, comprise one or more inserts and/or bladders (not shown). A foam element (not shown) may, for example, be disposed within the reservoir 248. In some embodiments, the foam element may compress in the case that the fluid in the heat exchanger 220 expands to exert increased forces within the heat exchanger 220. If the fluid expands upon heating and/or due to other environmental factors, for example, the foam may absorb the increased pressure in the heat exchanger 220 to substantially avoid damage to any or all components associated with the fluid flow paths.

Figure 3:
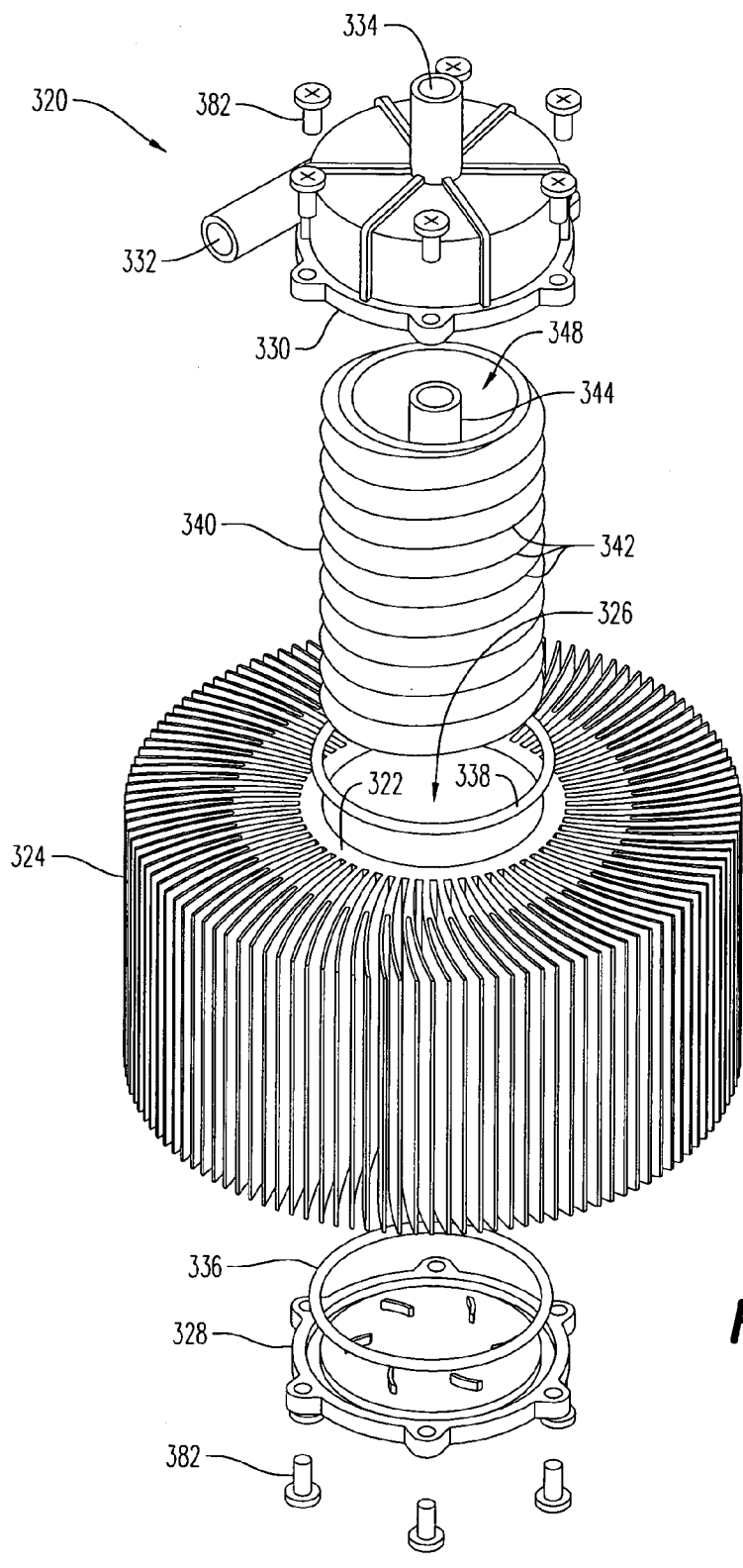
FIG. 3 is a perspective diagram of a heat exchanger according to some embodiments.

Referring now to FIG. 3, a perspective diagram of a heat exchanger 320 according to some embodiments is shown. In some embodiments, the heat exchanger 320 may be similar to the heat exchangers 120, 220 described in conjunction with any of FIG. 1 and/or FIG. 2. The heat exchanger 320 may, for example, be configured to remove, transfer, and/or dissipate heat. The heat exchanger 320 may comprise, in some embodiments, a core 322, fins 324, a cavity 326 defined by the core 322, a fist end cap 328, a second end cap 330, an inlet 332, an outlet 334, a first O-ring 336, a second O-ring 338, an element 340, grooves 342 on the element 340, a central conduit 344 within the element 340, and/or a reservoir 348. According to some embodiments, the components 320, 322, 324, 326, 328, 330, 332, 334, 336, 338, 340, 342, 344, 348 of the system 300 may be similar in configuration and/or functionality to the similarly-named components described in conjunction with FIG. 2. In some embodiments, fewer or more components than are shown in FIG. 3 may be included in the system 300.

In some embodiments, the heat exchanger 320 may comprise the core 322. As shown in FIG. 2, for example, the core 322 may comprise a hollow cylindrical form. In some embodiments, the heat exchanger 320 may comprise one or more fins 324 extending outwardly from the core 322. The fins 324 may be any configuration and/or type of heat-dissipating and/or radiating features that are or become known or practicable. As shown in FIG. 3, for example, the fins 324 may be Radial Curved Fin (RCF) protrusions from the core 322. The fins 324 may be configured, according to some embodiments, to place a substantial percentage or all of the surface area of the fins 324 within the highest speed of airflow directed from one or more fans (not shown in FIG. 3). The fins 324 may also, for example, be curved as shown to capture the swirl component of any air directed by a fan toward the fins 324. The combination of the core 322 and the fins 324 may, according to some embodiments, comprise a single extrusion and/or other element. The core 322 and the fins 324 may, for example, comprise a low-cost aluminum hollow form extrusion.

The core 322 may, according to some embodiments, define the cavity 326. The cavity 326 may, for example, be a cylindrical void disposed within the cylindrically-shaped core 322. In some embodiments, the cavity 326 may reduce the weight and/or cost of the heat exchanger 320. Typical heat exchangers, for example, may include solid cores that are expensive and/or substantially increase the weight of typical cooling solutions. The heat exchanger 320 in FIG. 3, however, may be lighter and/or cheaper to produce than typical heat exchangers. At least by utilizing a fluid to transfer heat to the core 322, for example, the hollow core 322 may be lighter and/or require substantially less material (e.g., aluminum and/or other metals) than typical heat exchangers. The use of the fluid to transfer heat to the core 322 may also or alternatively allow the diameter of the core 322 to be larger than in typical heat exchangers, which in turn allows the surface area of the core 322 and the fins 324 to be larger, increasing the efficiency of heat transfer from the heat exchanger 320.

The heat exchanger 320 may, according to some embodiments, comprise the first end cap 328 and/or the second end cap 330. The end caps 328, 330 may, for example, facilitate the retention, direction, transportation, and/or management of the fluid used to transfer heat to the core 322. In some embodiments, the first end cap 328 may be coupled to a first end of the core 322 (e.g., the bottom end as oriented in FIG. 3) and/or the second end cap 330 may be coupled to a second end of the core 322 (e.g., the upper end as oriented in FIG. 3). The end caps 328, 330 may, for example, substantially prevent the fluid circulated within the cavity 326 from leaking from the cavity 326 and/or may substantially prevent air from entering the cavity 326.

In some embodiments, the second end cap 330 may comprise the inlet 332 and/or the outlet 334. The second end cap 330 may function as a fluid manifold, for example, directing fluid into the cavity 326 via the inlet 332 and/or evacuating fluid from the cavity 326 via the outlet 324. According to some embodiments, the end caps 328, 330 may be constructed of any material and/or in any manner that is or becomes known or practicable. The end caps 328, 330 may, for example, be comprised of molded and/or extruded plastic. In some embodiments, the end caps 328, 330 may be coupled to the core 322 to form a hydraulic and/or hermetic seal that substantially prevents the fluid from leaking from the cavity 326 and/or that substantially prevents air from entering the cavity 326. Creation of the hydraulic and/or hermetic seal (and/or coupling of the end caps 328, 330 to the core 322) may be facilitated, according to some embodiments, by utilizing one or more O-rings 326, 328. The first O-ring 336 may be situated between the first end cap 328 and the core 322 and/or the second O-ring 338 may be situated between the second end cap 330 and the core 322. In some embodiments, other sealants, adhesives, fasteners, systems, devices, and/or methods may be used to couple and or seal the end caps 328, 330 to the core 322.

In some embodiments, the element 340 may be disposed within the cavity 326. The element 340 may, for example, direct the flow of the fluid inside the cavity 326. According to some embodiments, the element 340 may be shaped to fit inside the cavity 326. As shown in FIG. 3, the element 340 may be substantially cylindrically shaped. In some embodiments, the element 340 may comprise one or more grooves 342 (and/or other features) on the outside surface of the element 340. The element 340 may, for example, comprise a single groove 342 configured in a spiral pattern around the outside surface of the element 340. In the case that the element 340 is inserted into the cavity 326, the groove 342 may define one or more channels within which the fluid in the cavity 326 may flow.

For example, the outer surface of the element 340, when inserted into the cavity 326, may contact the inner surface of the core 322. In some embodiments, the areas of the outer surface of the element 340 that are between the paths of the groove 342 may substantially form seals between the channels created by the groove 342. The fluid entering the cavity 326 may, for example, be forced and/or directed in the space formed between the wall of the core 322 and the groove 342. According to some embodiments, other configurations of the groove 342 and/or the element 340 may be utilized to direct the fluid as desired within the cavity 326. In some embodiments, such as in the case that a spiral groove 342 is utilized, the configuration of the element 340 and/or the groove 342 may cause the fluid to pass over a large amount of the surface area of the inner wall of the core 322. This configuration may, for example, increase the amount of heat transferred from the fluid to the core 322. According to some embodiments, the element 340 may not be needed in the heat exchanger 320. The grooves 342 and/or other fluid direction features may, for example, be included in the extrusion comprising the core 322 and/or the fins 324. In some embodiments, the grooves 324 may be cut and/or otherwise included in the inner wall of the core 322.

In some embodiments, the fluid, after having completed the spiral path through the cavity 326 (e.g., at the bottom end of the heat exchanger 320 as shown in FIG. 3), may be directed into the central conduit 344 of the element 340. The central conduit 344 may, for example, be an outlet path that directs the cooled fluid to the outlet 334 of the second end cap 330. According to some embodiments, the reservoir 348 may separate the central conduit 344 from the inner wall of the element 340 that defines the back of the channels used to transport the heated fluid. In such a manner, for example, the cooled fluid may be substantially prevented from being re-heated by the heated fluid entering the cavity 326. This may, in some embodiments, increase the efficiency of the cooled fluid in collecting heat from any required and/or desired element outside of the heat exchanger 320.

According to some embodiments, the reservoir 348 may also or alternatively store a reserve of fluid (e.g., to replenish fluid lost by the heat exchanger 320 and/or other components associated with the fluid paths) and/or provide thermal mass to dampen peak thermal events experienced by the heat exchanger 320 and/or the fluid. In some embodiments, the reservoir 348 may comprise a foam element (not shown) that may be utilized to absorb and/or equalize pressure within the heat exchanger 320 and/or within the fluid paths generally. In some embodiments, the components 322, 324, 328, 330, 340 of the heat exchanger 320 may be coupled in any manner that is or becomes known or practicable. As shown in FIG. 3, for example, the end caps 328, 330 may be fastened to the core 322 and/or the fins 324 using the fasteners 382. The fasteners 382 may include, but are not limited to, rivets, screws, pins, adhesives, and/or any combination thereof. In some embodiments, the end caps 328, 330 may be molded directly onto the core 320 and/or the fins 322 (e.g., onto the core 322 and fin 324 extrusion).

Figure 4:
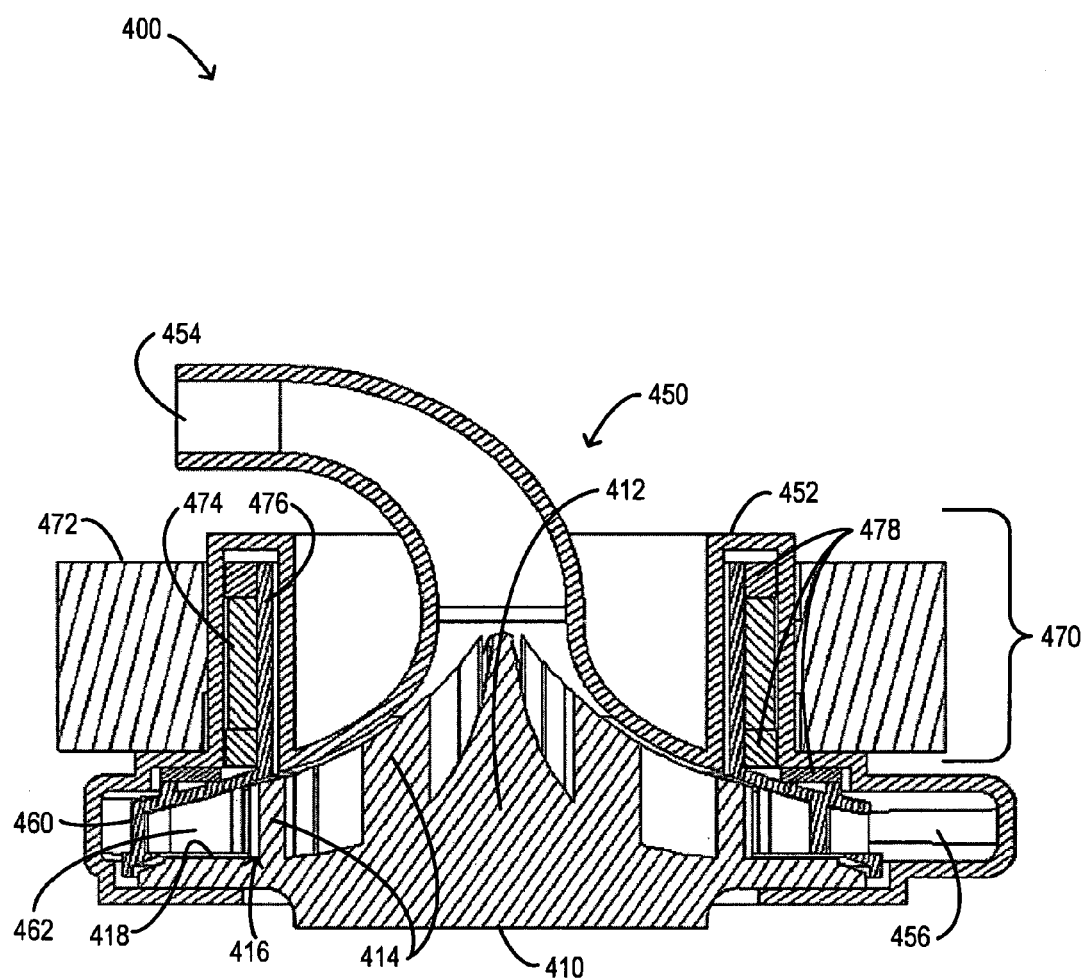
FIG. 4 is a cross-sectional diagram of a system according to some embodiments.

Turning now to FIG. 4, a cross-sectional diagram of a system 400 according to some embodiments is shown. In some embodiments, the system 400 may be configured to function with and/or may be otherwise associated with the system 100 and/or the heat exchangers 120, 220, 320 described in conjunction with any of FIG. 1, FIG. 2, and/or FIG. 3. The system 400 may comprise, for example, a cold plate 410 comprising a central portion 412, fins 414, a radius 416, and/or a surface 418. The system 400 may also or alternatively comprise a pump 450 comprising a housing 452, an inlet 454, and/or an outlet 456. The pump 450 may also or alternatively comprise an impeller 460 comprising vanes 462. In some embodiments, the system 400 and/or the pump 450 may comprise a motor 470 comprising one or more electromagnets 472, one or more magnets 474, a rotor 476, and/or one or more bearings 478. According to some embodiments, the components 410, 450 of the system 400 may be similar in configuration and/or functionality to the similarly-named components described in conjunction with FIG. 1. In some embodiments, fewer or more components than are shown in FIG. 4 may be included in the system 400.

As shown in FIG. 4, the system 400 may comprise a combination cold plate 410 and pump 450 (and/or motor 470). The cold plate 410 may, for example, be integrated into the pump 450. In some embodiments, the cold plate 410 may be configured not only to transfer heat to the fluid in the pump 450, but also to facilitate the direction of the fluid inside the pump housing 452. For example, the cold plate 410 may comprise a central portion 412. In some embodiments, the central portion 412 of the cold plate 410 may be the hottest portion of the cold plate 410. An electrical component (not shown in FIG. 4) may, for example, transfer more heat to the center of the cold plate 410 than to other portions of the cold plate. In some embodiments, the fluid entering the pump 450 via the inlet 454 may be initially directed to the central portion 412 of the cold plate 410. The central portion 412 may, as shown in FIG. 4, for example, be extended upward and/or into the fluid path.

The cold plate 414 may, for example, comprise one or more fins 414. The fins 414, according to some embodiments, may be taller near the central portion 412 of the cold plate, and may decrease in height and/or size as the radius of the cold plate 410 increases. In such a manner, for example, the fluid may be in greater contact with the hottest portions (e.g., the central portion 412) of the cold plate 410, increasing the efficiency of the heat transfer from the cold plate 410 to the fluid. According to some embodiments, the fins 414 and/or the central portion 412 of the cold plate 410 may be configured to direct the fluid in a radial fashion outward from the central portion 412 of the cold plate 410 to the extremities of the cold plate 410. In such a manner, for example, a cross-flow of heat exchange may be accomplished by directing the coldest fluid (e.g., the fluid entering the inlet 454) over the hottest portions (e.g., the central portion 412) of the cold plate 412, while the increasingly heated fluid travels over increasingly cooler portions of the cold plate 410. This cross-flow heat exchange may, according to some embodiments, achieve high efficiencies of heat transfer between the cold plate 410 and the fluid.

In some embodiments, the cold plate 410 may also or alternatively function as a flow inducer for the impeller 460. The fins 414 of the cold plate 410 may, for example, be curved and/or otherwise configured to direct the fluid entering from the inlet 454 to the vanes 462 of the impeller 460. The fins 414 may, according to some embodiments, direct the incoming fluid in such a manner so as to increase the efficiency of ingestion of the fluid by the impeller 460. In other words, the direction of the fluid by the fins 414 of the cold plate 410 may reduce friction losses in the fluid flow and/or substantially prevent cavitation and/or other flow disruptions. In some embodiments, the curved nature of the fins 414 may also or alternatively increase the efficiency of heat transfer from the fins 414 to the fluid. The fluid may be scrubbed across the fins 414, for example, as the fluid is forced to change direction by the curved fins 414.

The fins 414 of the cold plate 410 may, according to some embodiments, extend from the central portion 412 of the cold plate 410 to a radius 416 of the cold plate 410. The fins 414 may terminate at the radius 416, for example, to provide the surface 418 on the cold plate 410. The surface 418 may, according to some embodiments, provide an area through which the vanes 462 of the impeller 460 may travel. The vanes 462 of the impeller 460 may, for example, travel around the radius 416 of the cold plate 410 (e.g., around the fins 414 and/or on the surface 418). The vanes 462 may, according to some embodiments, direct the fluid received from the fins 414 to the outlet 456. In some embodiments, the inlet 454 and/or the outlet 456 may be defined and/or formed by the pump housing 452. According to some embodiments, the cold plate 410 may be coupled to the pump housing 452. The cold plate 410 may, for example, be coupled to the pump housing 452 to create a hydraulic and/or hermetic seal to substantially prevent the fluid from leaking from the pump housing 452 and/or to substantially prevent air from entering the pump housing 452. In some embodiments, the seal between the cold plate 410 and the pump housing 452 may comprise an O-ring (not shown in FIG. 4) and/or other sealant or fastener.

According to some embodiments, the inlet 454 may receive fluid from another device and/or component. The fluid may, for example, be cooled fluid received from a reservoir (e.g., the reservoir 148, 248, 348) and/or from a heat exchanger such as the heat exchangers 120, 220, 320 described herein. The fluid may, according to some embodiments, be heated by the cold plate 410 and directed by the cold plate 410 and/or the impeller 460 toward the outlet 456. The outlet 456 may, for example, direct the heated fluid to another device or component such as to a heat exchanger (e.g., the heat exchanger 120, 220, 320). In such a manner, for example, the system 400 and/or the pump 450 may circulate the fluid to operate a cooling cycle to remove heat from the cold plate 410 (and/or from an electric component coupled thereto).

In some embodiments, the system 400 may also or alternatively comprise the motor 470. The motor 470 may, for example, power the impeller 460 to direct the fluid toward the outlet 456. According to some embodiments, any type and/or configuration of motor that is or becomes known may be utilized to provide power to the impeller 460. As shown in FIG. 4, for example, the motor 470 may be or include a brushless motor such as a brushless Direct Current (DC) motor. The motor 470 may comprise, for example, one or more electromagnets 472 (and/or electromagnetic coils), one or more magnets 474 (e.g., permanent magnets), and/or a rotor 476. In some embodiments, the magnets 474 may be coupled to the rotor 476 (e.g., as is typical in brushless DC motors). According to some embodiments, one or more bearings 478 may be utilized to reduce friction and/or facilitate motion of the rotor 476.

As shown in FIG. 4, the motor 470 may be integrated into the pump 450. The rotor 476 (and the magnets 474 coupled thereto) may, for example, rotate within the pump housing 452. The bearings 478 may, according to some embodiments, facilitate the rotation of the rotor 476 within the pump housing 452. In some embodiments, some of the components 472, 474, 476 of the motor 470 may be separated by a wall of the pump housing 452. As shown in FIG. 4, for example, the rotor 476 and the magnets 474 may be disposed within the pump housing 452 (e.g., exposed to the fluid), while the electromagnets 472 may be disposed and/or coupled to the outside of the pump housing 452 (e.g., not exposed to the fluid). The magnetic and/or electromagnetic forces required to operate the motor 470 may, for example, pass through the wall of the pump housing 452 to permit the motor 470 to be integrated into the pump 450.

In some embodiments, integrating the motor 470 into the pump 450 may eliminate the need for a shaft (e.g., to power the impeller) and/or may eliminate the need for dynamic hydraulic and/or hermetic seals (e.g., that would typically be required surrounding a powered shaft protruding from the pump housing 452). The impeller 460 may, for example, be disposed upon and/or coupled to the rotor 476. As shown in FIG. 4, for example, the vanes 462 of the impeller 460 may be disposed on the bottom portion of the rotor 476 that rotates over the surface 418 of the cold plate 410. According to some embodiments, integrating the motor 470 into the pump 450 may reduce the potential for wear, leaking, and/or other problems associated with the pump 450.

The only non-fluid path seal that may be required in the system 400, for example, may be the seal between the cold plate 410 and the pump housing 452. The integrated motor 470 may be brushless and/or may not require a shaft penetrating the pump housing 452. Incorporating the rotor 476 and/or the magnets 474 into the fluid within the pump housing 452 may also or alternatively, according to some embodiments, create a hydroscopic bearing effect that may reduce the wear on various system 400 components (such as the bearings 478, the rotor 476, and/or the pump housing 452 itself). In some embodiments, the integrated motor 470 may also or alternatively allow the diameter of the impeller 460 and/or rotor 476 to be larger than in typical pumps and/or motors. The larger diameter impeller 460 and/or rotor 476 may, for example, allow the motor to spin at lower Revolutions Per Minute (RPM) than typical motors, while producing higher torque, flow, and/or pressure.

Figure 5:
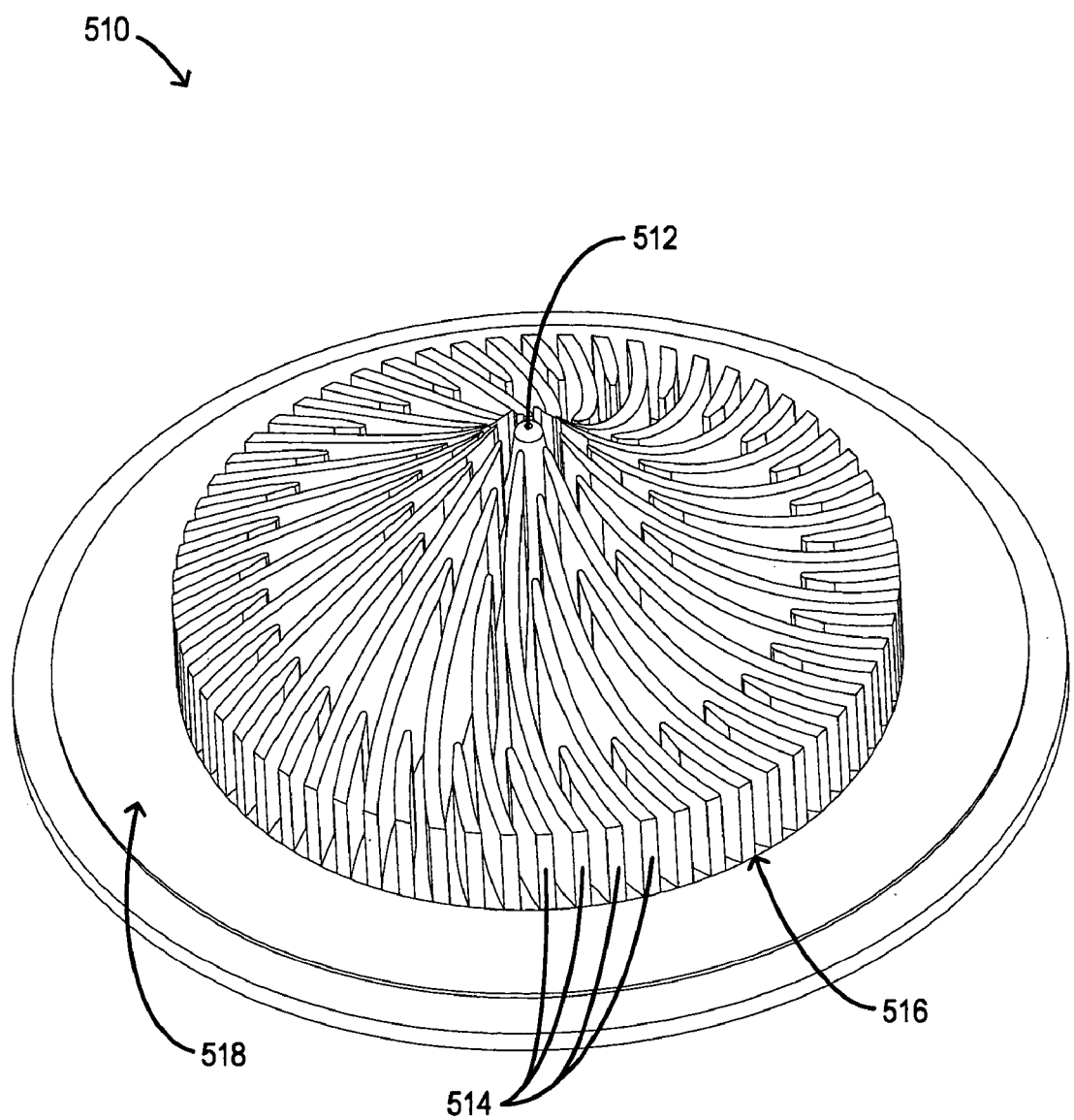
FIG. 5 is a perspective diagram of a cold plate according to some embodiments.

Referring to FIG. 5, a perspective diagram of a cold plate 510 according to some embodiments is shown. In some embodiments, the cold plate 510 may be similar to the cold plates 110, 410 described in conjunction with any of FIG. 1 and/or FIG. 4. The cold plate 510 may comprise, for example, a central portion 512, one or more fins 514, a radius 516, and/or a surface 518. According to some embodiments, the components 512, 514, 516, 518 of the system 500 may be similar in configuration and/or functionality to the similarly-named components described in conjunction with FIG. 4. In some embodiments, fewer or more components than are shown in FIG. 5 may be included in the system 500.

The cold plate 510 may, according to some embodiments, be or include a disk and/or other circular configuration. As shown in FIG. 5, for example, the cold plate 510 may be a finned-disk (e.g., comprising the fins 514). In some embodiments, the cold plate 510 may be comprised of copper and/or another thermally conductive material. The cold plate 510 may, for example, be a finned copper disk. According to some embodiments, the cold plate 510 may be manufactured using a Metal Injection Molding (MIM) process or various forging techniques. The cold plate 510 may, in some embodiments, also or alternatively be shaped and/or otherwise configured to fit inside and/or otherwise be integrated with a pump such as the pump 450.

According to some embodiments, the cold plate 510 may be an Integrated Heat Spreader (IHS) coupled to an electronic device and/or electrical component (not shown in FIG. 5). The cold plate 510 may, for example, receive heat from the electronic device (e.g., coupled to the underside of the cold plate 510). According to some embodiments, adhesive and/or thermal grease and/or other thermal interface material may be applied between the electronic device and the cold plate 510 to facilitate heat transfer and/or coupling. In some embodiments, a fluid may also or alternatively be passed over and/or through the cold plate 510 to remove heat from the cold plate 510.

In some embodiments, the central portion 512 of the cold plate 510 may be the hottest portion of the cold plate 510 (e.g., the temperature of the cold plate 510 may decrease as the radius increases). This may be due at least in part, for example, to the concentration of heat from the electronic device toward the central portion 512 of the cold plate 510. The fins 514 of the cold plate 510 may, according to some embodiments, be configured to efficiently remove and/or dissipate heat from the cold plate 510. The fins 514 may, as shown in FIG. 5 for example, be taller near the central portion 512 of the cold plate 510 and decrease in height, size, and/or surface area as the radius of the cold plate 510 increases. The fins 514 may also or alternatively increase in number (e.g., as shown in FIG. 5) as the radius of the cold plate 510 increases. The number and/or size of the fins 514 may be designed and/or controlled, according to some embodiments, to manage the cross-sectional area of the cold plate 510 as a function of the radius of the cold plate 510. The ratio may be maintained at a substantially constant value, for example, to increase the efficiency with which the cold plate 510 may transfer heat to the fluid.

The fins 514 of the cold plate 510 may also or alternatively be curved, as shown in FIG. 5, for example. The orientation of the fins 514 may, according to some embodiments, cause the fluid directed toward the cold plate 510 to be directed in a radial fashion toward the radius 516 of the cold plate 510. The fins 514 may, for example, terminate at the radius 516 so that an impeller (e.g., the impeller 460) may rotate around the fins 514. The surface 518 situated between the radius 516 and the edge of the cold plate 510 may, for example, be used to rotate the vanes of an impeller around the fins 514. The curvature of the fins 514 may, according to some embodiments, direct the fluid toward the vanes of the impeller, increasing the efficiency of the fluid flow through the impeller.

Figure 6:
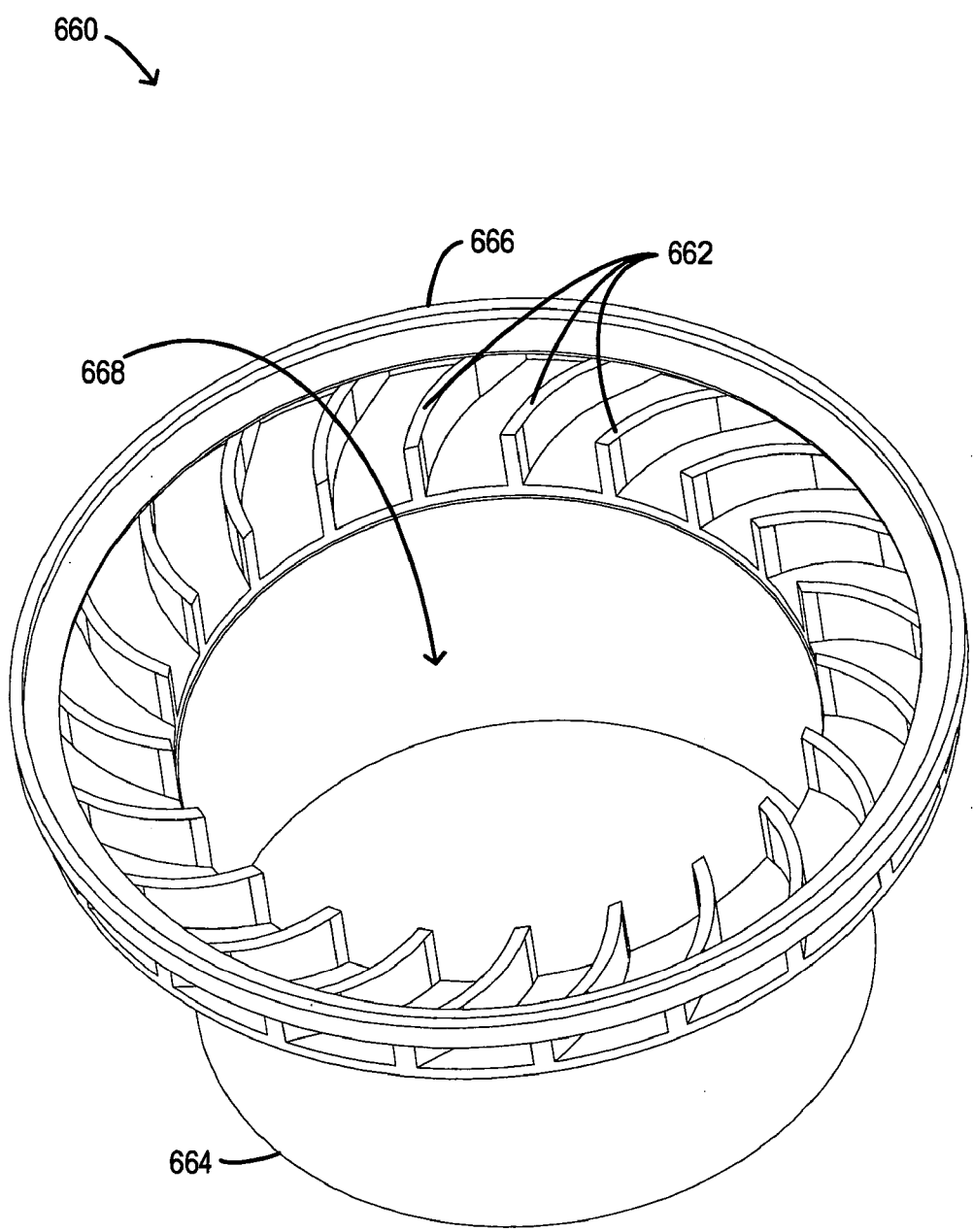
FIG. 6 is a perspective diagram of an impeller according to some embodiments.

Turning now to FIG. 6, a perspective diagram of an impeller 660 according to some embodiments is shown. In some embodiments, the impeller 660 may be similar to the impeller 460 described in conjunction with FIG. 4. The impeller 660 may comprise, for example, one or more vanes 662, a shaft portion 664, and/or a bottom edge 666. In some embodiments, the impeller 660 may also or alternatively define a cavity 668. According to some embodiments, the components 662 of the system 600 may be similar in configuration and/or functionality to the similarly-named components described in conjunction with FIG. 4. In some embodiments, fewer or more components than are shown in FIG. 6 may be included in the system 600.

According to some embodiments, the perspective diagram of the impeller 660 may be a view of the bottom of the impeller 660. The bottom edge 666 of the impeller 660 may, for example, be configured to travel along the surface 418, 518 of the cold plate 410, 510. In some embodiments, the shaft portion 664 of the impeller 660 may also or alternatively be or include the rotor 476 of the motor 470. The impeller 660 may, for example, fit within the pump housing 452, with the cold plate 410 fitting in the cavity 668 defined by the impeller 660. In some embodiments for example, a fluid used to transfer heat from a cold plate may travel up through the cavity 668 toward the vanes 662. The fluid may, for example, be directed and/or induced to flow toward the vanes 662 by various fins (e.g., fins 414, 514) of the cold plate.

According to some embodiments, the impeller 660 may spin around the cold plate, receiving the fluid and directing the fluid toward one or more particular points. The fluid may be directed, for example, toward an outlet such as the outlet 456 defined by the pump housing 452. In some embodiments, the vanes 662 may be curved (as shown in FIG. 6). The curvature of the vanes 662 may, according to some embodiments, be similar to and/or otherwise associated with a curvature of the fins of the cold plate (not shown in FIG. 6) disposed within the cavity 668. The impeller 660 and/or the vanes 662 may be comprised of any materials that are or become known or practicable.

Figure 7:
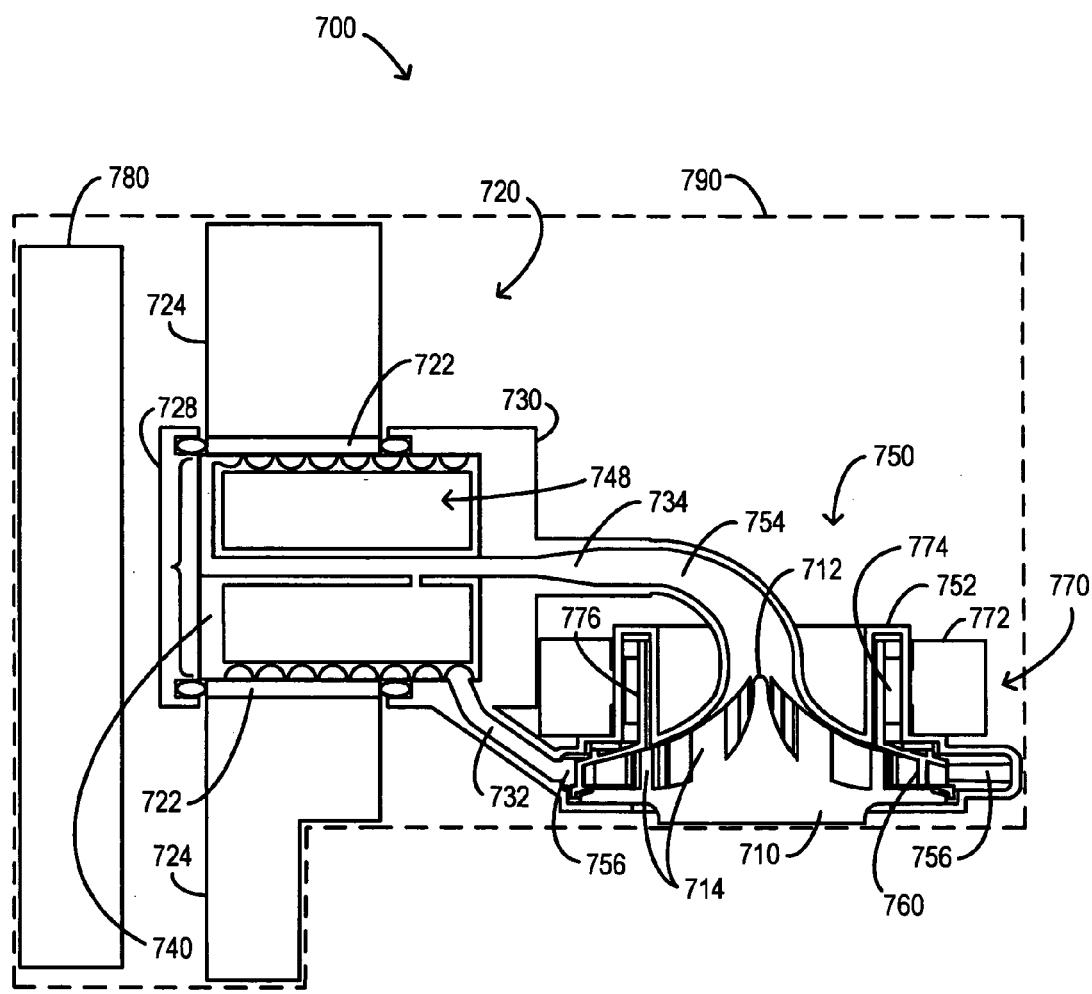
FIG. 7 is a cross-sectional diagram of a cooling system according to some embodiments.

Referring now to FIG. 7, a cross-sectional diagram of a cooling system 700 according to some embodiments is shown. In some embodiments, the cooling system 700 may be similar to the system 100 described in conjunction with FIG. 1. The cooling system 700 may comprise, for example, a cold plate 710 comprising a central portion 712, and/or one or more fins 714, and/or a heat exchanger 720 comprising a core 722, one or more fins 724, and/or end caps 728, 730. The second end cap 730 may, according to some embodiments, comprise and/or define and inlet 732 and/or an outlet 734. In some embodiments, the heat exchanger may also or alternatively comprise an element 740 to direct fluid within the heat exchanger and/or a reservoir 748. In some embodiments, the cooling system 700 may comprise a pump 750 comprising a pump housing 752, an inlet 754, and/or an outlet 756.

According to some embodiments, the pump 750 may comprise an impeller 760 and/or be integrated with a motor 770. The motor 770 may comprise an electromagnet 772, a permanent magnet 774, and/or a rotor 776. The cooling system 700 may also or alternatively comprise a fan 780 and/or a cooling solution space 790. According to some embodiments, the components 710, 712, 714, 720, 722, 724, 728, 730, 732, 734, 740, 748, 750, 752, 754, 756, 760, 770, 772, 774, 776, 780 of the cooling system 700 may be similar in configuration and/or functionality to the similarly-named components described in conjunction with any of FIG. 1, FIG. 2, FIG. 3, FIG. 4, FIG. 5, and/or FIG. 6. In some embodiments, fewer or more components than are shown in FIG. 7 may be included in the cooling system 700.

The cooling system 700 may, according to some embodiments, be or include a cooling solution. The cooling system 700 may, for example, comprise a cooling solution for an electronic device such as a PC or computer server. In some embodiments, the cooling system 700 may comprise multiple components that are coupled and/or otherwise in communication to remove, move, and/or dissipate heat. The cooling system 700 may comprise, for example, the cold plate 710 to receive heat from a source (e.g., an electronic component). A fluid may, according to some embodiments, flow over and/or through the cold plate 710 to remove heat from the cold plate 710. In some embodiments, the cold plate 710 may comprise a central portion 712 from which fins 714 of decreasing size may extend along the cold plate 710. The fins 714 may, for example, facilitate the transfer of heat from the cold plate 710 to the fluid and/or may induce the fluid to flow in one or more particular directions.

The cooling system 700 may also comprise the pump 750, which may, for example, be integrated with the cold plate 710 (e.g., the cold plate 710 may be at least partially disposed within the pump housing 752). The pump 750 may, in some embodiments, cause the fluid to circulate within the system 700. The heated fluid from the cold plate 710 may, for example, be directed by the fins 714 of the cold plate 710 to the impeller 760 of the pump 750. The impeller 760 may, according to some embodiments, be powered by the motor 770. In some embodiments, the motor 770 may also or alternatively be integrated with the pump 750. The electromagnets 772 of the motor 770 may be disposed and/or coupled to the outside of the pump housing 752, for example, while the rotor 776 and/or the permanent magnets 774 of the motor 770 may be disposed and/or coupled inside of the pump housing 752. The motor 770 may, according to some embodiments, cause the impeller 760 to rotate and direct the fluid toward the outlet 756 defined by the pump housing 752.

The heated fluid may, for example, be directed via the outlet 756 to the inlet 732 of the heat exchanger 720 (and/or of the second end cap 730). In some embodiments, the heat exchanger 720 may remove heat from the fluid and/or radiate the heat (and/or conduct the heat) into the environment within and/or around the cooling system 700. The heat exchanger 720 may, according to some embodiments, comprise the core 722 and/or fins 724 emanating from the core 722. The fins 724 may, for example, conduct heat from the core 722 and radiate (and/or conduct) the heat into the area around, between, and/or near the fins 724. In some embodiments, the fan 780 may facilitate the removal of heat from the fins 724 by blowing and/or directing air over, between, and/or toward the fins 724. In some embodiments, the fins 724 may be emanate in a radial fashion from a cylindrically-shaped core 722 to efficiently utilize the air flow provided by the fan 780.

According to some embodiments, the heat exchanger 720 may also or alternatively comprise the end caps 728, 730 to retain fluid within the heat exchanger 720 and/or the element 740 disposed within the heat exchanger 720 to direct fluid within the heat exchanger 720. The element 740 may, for example, be configured to increase the amount of surface area that the fluid passes over within the core 722. The element 740 may define one or more paths or channels, according to some embodiments, that direct the fluid along the walls of the core 722. The paths may be lengthy to increase the amount of time and/or surface area that the fluid may scrub the walls to transfer heat to the core 722. The paths may comprise, for example, a spiral path along the inner wall of the core 722. In some embodiments, the heat exchanger 720 and/or the cooling system 700 may also or alternatively comprise the reservoir 748 to provide, receive, and/or store fluid for the cooling system 700. The cooled fluid exiting the heat exchanger 720 may, for example, be stored in the reservoir 748.

In some embodiments, the cooled fluid may exit the heat exchanger via the outlet 734. The outlet 734 may, for example, be coupled to and/or otherwise associated with the inlet 754 of the pump 750. In such a manner, for example, the cooled fluid may be directed back to the cold plate 710 within the pump housing 752. In some embodiments, the cooled fluid may receive heat from the cold plate 710 and be directed by the impeller 760 back to the heat exchanger 720 to remove heat from the fluid. This cooling loop may, according to some embodiments, substantially continuously (and/or as needed) remove heat from an electrical component (not shown in FIG. 7). In some embodiments, the fluid circulated within the cooling system 700 may be or include any fluid that is or becomes practicable for transferring heat. In some embodiments, the fluid may be substantially comprised of water. According to some embodiments, the fluid may be a combination of fluids such as a combination of water and propylene glycol. The propylene glycol may be utilized at about thirty-five percent by volume, according to some embodiments, to substantially mitigate environmental effects such as freezing that the cooling system 700 may encounter (e.g., during shipping).

The cooling system 700 may, in some embodiments, be configured to fit within the cooling solution space 790. The cooling solution space 790 may, for example, be an area and/or volume within an electrical device or component that is available for placement and/or mounting of a cooling solution. In some embodiments, the cooling solution space 790 may, for example, be or include a cooling solution space within a device configured in accordance with the Balanced Technology eXtended (BTX) Interface Specification Version 1.0a (February 2004) published by Intel® Corporation. According to some embodiments, the cooling system 700 may fit within the cooling solution space 790 and provide room within the cooling solution space 790 to allow the airflow from the fan 780 to dissipate and/or transport heated air removed from the fins 724 of the heat exchanger 720. In some embodiments, one or more of the components 710, 720, 750, 770, 780 of the cooling system 700 may be configured to fit within the cooling solution space 790. As shown in FIG. 7, for example, the one or more of the fins 724 (and/or portions thereof) may be altered to fit within the cooling solution space 790.

In some embodiments, the cooling system 700 may provide many advantages over typical cooling solutions. The integration of multiple components (e.g., the pump 750, the cold plate 710, and/or the motor 770) and/or the configuration that closely couples the heat exchanger 720 to the pump 750 may, for example, substantially reduce the space required for the cooling system 700. In some embodiments, reducing the required space may also reduce the amount of interference with the airflow from the fan 780, increasing the efficiency of the cooling system 700. In the case that the fins 724 of the heat exchanger 720 emanate in a radial fashion from the core 722, the cooling system 700 may also or alternatively provide highly efficient use of the airflow from the fan 780 by positioning a large percentage of the area of the fins 724 directly within the streamlines created by the fan 780.

According to some embodiments, the obstruction to airflow within the cooling system 700 may be further reduced by the configuration that places the fluid management components (728, 730, 732, 734, 740, 748) in the shadow of the hub of the fan 780. In other words, the fluid management components may, as shown in FIG. 7, be positioned behind a central portion of the fan 780, which may typically be the fan hub, which produces minimal or no airflow. In the case that the components 710, 720, 750, 770, 780 of the cooling system are configured as describe in some embodiments herein, the cooling system may also or alternatively be substantially lighter and/or cheaper to manufacture than typical cooling solutions. In the case that the heat exchanger 720 comprises a low-cost aluminum extrusion and/or a hollow core 722, for example, the amount of metal and/or mass required for heat dissipation may be substantially reduced. Similarly, utilizing plastic to form the end caps 728, 730 and/or the element 740 may further reduce the weight and/or cost of the cooling system 700.

In some embodiments, the close coupling and/or orientations of the components 710, 720, 750, 770, 780 of the cooling system 700 may also or alternatively increase the reliability of the cooling system 700. The close coupling of the components 710, 720, 750, 770, 780 shown in FIG. 7, for example, may substantially reduce the distance and/or area through which fluid may be lost to leakage (e.g., through hydroscopic plastic elements). The inlet 732 and the outlet 734 of the heat exchanger may, for example, be substantially the only areas of plastic fluid path via which fluid may seep. Typical systems include much longer fluid path lengths in contact with externally exposed plastic areas. No hoses and/or tubes may be necessary in the cooling system 700, for example. The reliability of the cooling system 700 may also or alternatively be increased by the integration of the pump 750 and the cold plate 710 and/or the motor 770. The integration may, for example, reduce the number of dynamic seals and/or wear surfaces within the pump 750, increasing the reliability of the pump 750. The motor 770 itself may also, for example, lack any substantially wearable parts or components (e.g., brushes).

Figure 8:
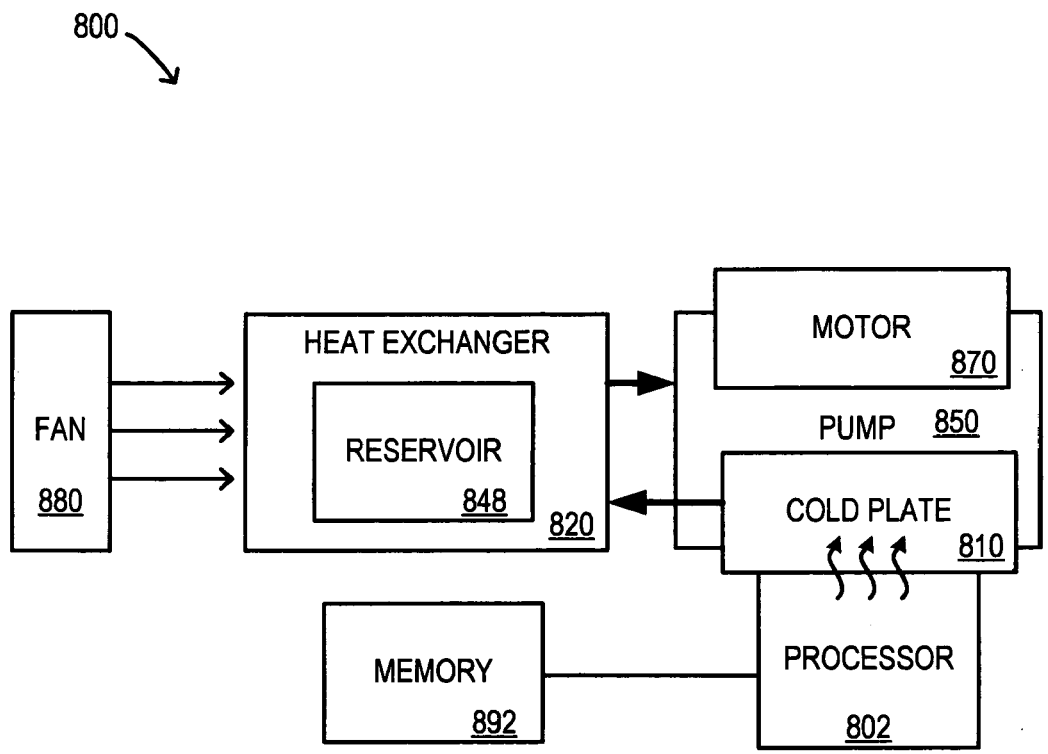
FIG. 8 is a block diagram of a system according to some embodiments.

Turning to FIG. 8, a block diagram of a system 800 according to some embodiments is shown. In some embodiments, the system 800 may be similar to the systems 100, 700 described in conjunction with any of FIG. 1 and/or FIG. 7. The system 800 may comprise, for example, a processor 802, a cold plate 810, a heat exchanger 820, a reservoir 848, a pump 850, a motor 870, a fan 880, and/or a memory 892.

According to some embodiments, the components 802, 810, 820, 848, 850, 870, 880 of the system 800 may be similar in configuration and/or functionality to the similarly-named components described in conjunction with any of FIG. 1, FIG. 2, FIG. 3, FIG. 4, FIG. 5, FIG. 6, and/or FIG. 7. In some embodiments, fewer or more components than are shown in FIG. 8 may be included in the system 800.

The processor 802 may be or include any number of processors, which may be any type or configuration of processor, microprocessor, and/or micro-engine that is or becomes known or available. In some embodiments, other electronic and/or electrical devices may be utilized in place of or in addition to the processor 802. The processor 802 may, for example, be or include any device, object, and/or component that generates, stores, and/or requires removal of heat. According to some embodiments, the processor 802 may be an XScale® Processor such as an Intel® PXA270 XScale® processor. The memory 892 may be or include, according to some embodiments, one or more magnetic storage devices, such as hard disks, one or more optical storage devices, and/or solid state storage. The memory 892 may store, for example, applications, programs, procedures, and/or modules that store instructions to be executed by the processor 802. The memory 892 may comprise, according to some embodiments, any type of memory for storing data, such as a Single Data Rate Random Access Memory (SDR-RAM), a Double Data Rate Random Access Memory (DDR-RAM), or a Programmable Read Only Memory (PROM).

In some embodiments, the cold plate 810 may be an IHS coupled to the processor 802. The cold plate 810 may, for example, remove and/or receive heat (e.g., via conduction) from the processor 802 (e.g., represented by the wavy lines in FIG. 8). According to some embodiments, such as shown in FIG. 8 for example, the cold plate 810 may be integrated with the pump 850. The cold plate 810 may, for example, transfer heat to a fluid in the pump 850 and/or facilitate the flow of the fluid within the pump 850 as described herein. In some embodiments, the motor 870 may also or alternatively be integrated with the pump 850. The motor 870 may, for example, include components disposed within the pump 850 and/or components disposed outside of the pump 850. In some embodiments, the motor 870 may power the pump 850 to direct the fluid (e.g., the heated fluid) to the heat exchanger 820. The heat exchanger 820 may then, for example, transfer and/or receive heat from the fluid and dissipate and/or remove the heat from and/or within the system 800. The fan 880 may, in some embodiments, facilitate the removal and/or dissipation of heat by blowing air toward the heat exchanger 820. According to some embodiments, the reservoir 848 to store the fluid (and/or a portion thereof) may be integrated with the heat exchanger 820. The fluid (e.g., the cooled fluid) may, for example, be directed from the heat exchanger 820 into the reservoir 848. According to some embodiments, the cooled fluid may be sent back to the pump 850 (and/or pump 850, motor 870, cold plate 810 combination) to continue the cooling cycle.

In some embodiments, any or all of the cooling components 810, 820, 848, 850, 870, 880 may be or include components similar to those described herein. According to some embodiments, one or all of the cooling components 810, 820, 848, 850, 870, 880 may also or alternatively comprise one or more conventional devices to perform the required functionality of the particular component. As an example, the heat exchanger 820 may, in some embodiments, be a typical heat sink and/or heat pipe. The pump 850 may also or alternatively, for example, be a typical centrifugal pump powered by a standard DC motor (e.g., coupled by a shaft to the pump 850).

The several embodiments described herein are solely for the purpose of illustration. Other embodiments may be practiced with modifications and alterations limited only by the claims.

What is claimed is:

1. A system, comprising:
  a heat exchanger comprising:
    a core having a first end and a second end, wherein the core defines a cavity extending between the first and second ends;
    a plurality of fins extending outwardly from the core between the first and second ends;
    an inlet to accept a fluid;
    an outlet to evacuate the fluid; and
    a shaped element disposed within the cavity of the core, wherein the shaped element is to direct fluid within the cavity; and
  a pump comprising:
    a housing defining an inlet to accept the fluid and an outlet to evacuate the fluid;
    an impeller disposed within the housing, wherein the impeller is to move the fluid toward the outlet;
    a motor to power the impeller; and
    a cold plate having a bottom surface,
    wherein a first portion of the bottom surface is enclosed by the housing, and
  wherein a second portion of the bottom surface is not enclosed by the housing.

2. The system of claim 1, wherein the pump accepts the fluid from one of a plurality of heat exchangers.

3. The system of claim 2, wherein the heat exchanger is one of the plurality of heat exchangers.

4. The system of claim 1, wherein the cold plate comprises a plurality of cold plates.

5. The system of claim 1, wherein at least one of the core or the shaped element define one or more channels to direct the fluid within the cavity.

6. The system of claim 1, wherein the shaped element comprises an exterior surface that contacts an interior surface of the cavity, and wherein the exterior surface of the shaped element comprises at least one groove.

7. The system of claim 6, wherein the at least one groove defines at least one channel between the exterior surface of the shaped element and the interior surface of the cavity, and wherein the at least one channel is to direct the fluid.

8. The system of claim 7, wherein the at least one channel is oriented in a substantially spiral configuration.

9. The system of claim 1, further comprising:
  a reservoir disposed within a central portion of the cavity.

10. The system of claim 9, wherein the reservoir is defined by the shaped element.

11. The system of claim 9, wherein the reservoir is hydraulically coupled to a path extending through the central portion of the cavity.

12. The system of claim 9, further comprising:
  a foam element disposed within the reservoir, wherein the foam element is to compress in the case that the fluid expands to apply force to the foam.

13. A system, comprising:
  a heat exchanger comprising:
    a core having a first end and a second end, wherein the core defines a cavity extending between the first and second ends;

a plurality of fins extending outwardly from the core between the first and second ends;
an inlet to accept a fluid;
an outlet to evacuate the fluid; and
a shaped element disposed within the cavity of the core, wherein the shaped element is to direct fluid within the cavity;
a pump comprising:
a housing defining an inlet to accept the fluid and an outlet to evacuate the fluid;
an impeller disposed within the housing, wherein the impeller is to move the fluid toward the outlet;
a motor to power the impeller; and
a cold plate having a bottom surface,
wherein a first portion of the bottom surface is enclosed by the housing, and
wherein a second portion of the bottom surface is not enclosed by the housing;
a processor coupled to the cold plate; and
a double data rate memory coupled to the processor.

14. The system of claim 13, further comprising:
a reservoir disposed within a central portion of the cavity.

15. The system of claim 1, wherein the pump accepts the fluid from one of a plurality of heat exchangers.

* * * * *